(12) United States Patent
Bi

(10) Patent No.: US 7,038,482 B1
(45) Date of Patent: May 2, 2006

(54) CIRCUIT AND METHOD FOR AUTOMATIC MEASUREMENT AND COMPENSATION OF TRANSISTOR THRESHOLD VOLTAGE MISMATCH

(75) Inventor: Yafei Bi, Fremont, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 11/040,441

(22) Filed: Jan. 21, 2005

Related U.S. Application Data

(60) Provisional application No. 60/554,663, filed on Mar. 19, 2004.

(51) Int. Cl.
*G01R 31/26* (2006.01)
(52) U.S. Cl. .................. 324/769; 324/763; 324/765
(58) Field of Classification Search .............. None
See application file for complete search history.

(56) References Cited

U.S. PATENT DOCUMENTS

| | | | |
|---|---|---|---|
| 5,013,940 A | 5/1991 | Ansel | |
| 5,568,081 A | 10/1996 | Lui et al. | |
| 5,777,944 A | 7/1998 | Knaack et al. | |
| 5,986,489 A | 11/1999 | Raza et al. | |
| 6,005,821 A | 12/1999 | Knaack et al. | |
| 6,060,921 A | 5/2000 | Daniell | |
| 6,181,621 B1 | 1/2001 | Lovett | |
| 6,237,107 B1 | 5/2001 | Williams et al. | |
| 6,380,762 B1 | 4/2002 | Pancholy et al. | |
| 6,476,654 B1 * | 11/2002 | Tanaka | ........................ 327/170 |
| 6,542,004 B1 | 4/2003 | Dunne | |
| 6,574,158 B1 | 6/2003 | Thamaran | |
| 6,664,810 B1 | 12/2003 | Pancholy et al. | |

OTHER PUBLICATIONS

U.S. Appl. No. 60/532,453, filed Zupeau et al.
Shin et al. "A Slew-Rate Controlled Output Driver Using PLL as Compensation Circuit,".IEEE Journal of Solid-State Circuits, Jul. 2003, pp. 1227-1233, vol. 38, No. 7.

* cited by examiner

Primary Examiner—Minh N. Tang
(74) Attorney, Agent, or Firm—Bradley T. Sako

(57) ABSTRACT

An automatic transistor threshold measuring circuit (100) can include a current source circuit (102) that can provide increasing amounts of current to a measured transistor (N1) according to current setting values ($I_{CODE}$). When a gate-to-source voltage of measured transistor (N1) essentially equals a first reference voltage (Vref1), the current setting values ($I_{CODE}$) is stored. The process is repeated with a second reference voltage (Vref1) to acquire a second current setting value ($I_{CODE}$) A threshold voltage for the measured transistor (N1) can be calculated according to the reference voltages (Vref1 and Vref2) and stored current setting values ($I_{CODE}$).

20 Claims, 7 Drawing Sheets

CIRCUIT AND METHOD FOR AUTOMATIC MEASUREMENT AND COMPENSATION OF TRANSISTOR THRESHOLD VOLTAGE MISMATCH

This application claims the benefit of U.S. provisional patent application Ser. No. 60/554,663, filed Mar. 19, 2004.

TECHNICAL FIELD

The present invention relates generally to integrated circuits (IC) having on-chip circuits for measuring or characterizing device features, and more particularly, to methods and circuits for characterizing transistor threshold voltage (Vt) of the IC and to compensate for Vt mismatch among the transistors of the IC.

BACKGROUND OF THE INVENTION

Fabrication of integrated circuits (ICs) typically includes numerous steps of deposition, diffusion, etching, implantation, lithography, etc. Inherent variations in each of these processes can result in transistor devices having individual threshold voltages (Vt) that are slightly higher, or lower, than desired and/or result in the effective gate length of the individual transistor devices varying slightly from an ideal value. Consequently, variations in transistor threshold voltages can arise due to such process variations.

In addition, variations in biasing or power supply voltages, and environmental factors can further impact device or IC performance. A device (e.g., transistor) if not an entire IC can either speed up or slow down due variations in biasing or supply voltages applied to individual devices or applied globally across the IC. Variations in temperature around the IC or a particular device can also have a substantial effect on the operation of the device.

Any one or all of these process, voltage and temperature (PVT) variations can have a significant effect on the performance of that device causing a reduction in timing margins and/or switching frequency. In particular, variations in threshold voltage (Vt) across expected process variations and operating temperatures has become a major problem in deep sub-micron designs, where a power supply voltage is, or may become low with respect to higher device size circuits.

A conventional method is known that can compensate for process variation (including Vt variation) in, for example, output drivers. Such a method is shown in "A Slew-Rate Controlled Output Driver Using PLL as Compensation Circuit", *IEEE Journal of Solid States Circuit*, Vol. 38, No. 7, July 2003, pp. 1227–1233, by Shin et al. According to such a conventional approaches, a control voltage of a Voltage Controlled Oscillator (VCO) can compensate an output driver slew rate in the event Vt variation alters the output driver performance. More particularly, the above conventional approach can use a control voltage of a VCO in a Phase Locked Loop (PLL) formed on the same die as the IC as an indicator for process variation, including Vt variations. Such a control voltage can then be used to compensate the slew rate of the output driver. Variation of slew rate can be reduced by about 25% percent based on the VCO control voltage.

Although the above conventional approach provides an improvement over previous uncompensated designs, the above conventional approach may not be wholly satisfactory for a number of reasons. First, PLLs can occupy a significant amount of area on the die, and can be difficult to design/fabricate using present process technology. Second, a VCO control voltage may reflect only a general trend of the Vt variation, and hence may not necessarily be a precise indicator of Vt variation across the IC or in a particular device.

Accordingly, there is a need for a new on-chip circuit and method for automatically calculating or measuring the variations in the Vt of metal-oxide-semiconductor (MOS) type transistors in an IC at arbitrary locations.

Further, it is also desirable that the results of the calculated or measured variations in Vt can then be used to compensate Vt-sensitive blocks, where Vt mismatch/variation affects the circuit performance. As but one particular example, it is desirable that the results can be used for body biasing in a triple well process, where speed gain or leakage current reduction can be achieved by biasing the substrate/well.

SUMMARY OF THE INVENTION

The present invention may provide a solution to these and other problems, and offers further advantages over conventional output buffers and methods of operating the same. According to one aspect, the present invention is directed to circuits and methods of automatically determining a threshold voltage (Vt) of a transistor on an integrated circuit using an on-chip circuit.

According to one embodiment, the present invention can include a method of determining a threshold voltage (Vt) of at least one of a number of transistors in an integrated circuit. The method can include a) sequentially changing the magnitude of a current provided to a transistor according to M-bit code values until an output voltage from the transistor is substantially equal to a reference voltage, where M is an integer greater than 1; b) storing an M-bit code value that corresponds to the current that results in the output voltage being substantially equal to the reference voltage; and c) repeating steps a) and b) for a different reference voltage. Steps a) through c) can be performed by circuits formed in the integrated circuit. In such an arrangement, values for calculating a threshold value can be rapidly acquired.

According to one aspect of the embodiments, the method may further include selecting one of a number of transistors on the integrated circuit as the transistor to which the current is provided. Such an arrangement can allow threshold voltages to be measured at any of various locations of the same integrated circuit.

According to another aspect of the embodiments, the method may further include generating a first current value from a first M-bit code value corresponding to a first reference voltage, and generating a second current value from a second M-bit code value corresponding to a second reference voltage. Such an approach can result in the acquisition of two drain current values for the measured transistor.

According to another aspect of the embodiments, the method may further include calculating a threshold voltage of the transistor with the first reference voltage, second reference voltage, first current value, and second current value. Further, such a calculation can be according to the relationship:

$$V_t = V_{GS1} - K\sqrt{I_{D1}} \text{ or } V_t = V_{GS2} - K\sqrt{I_{D2}}, \text{ where}$$

$$K = \frac{V_{GS1} - V_{GS2}}{\sqrt{I_{D1}} - \sqrt{I_{D2}}}, \text{ and}$$

where $V_{GS1}$ is derived from the first reference voltage and $I_{D1}$ is derived from the first current value, and $V_{GS2}$ is derived from the second reference voltage and $I_{D2}$ is derived from the second current value.

In this way based on two sets of values, that can be rapidly acquired, a transistor threshold voltage can be calculated.

According to another aspect of the embodiments, the method may further include adjusting the impedance of an output driver path of the integrated circuit according to the calculated threshold voltage.

According to another aspect of the embodiments, the method may further include adjusting a voltage controlled oscillator (VCO) gain for a VCO formed in the integrated circuit according to the calculated threshold voltage.

According to another aspect of the embodiments, the method may further include adjusting a bias voltage provided to a well formed in the substrate of the integrated circuit according to the calculated threshold voltage.

According to another aspect of the embodiments, the method may further include adjusting one or more programming voltages provided to a plurality of nonvolatile transistors formed in the integrated circuit according to the calculated threshold voltage.

According to another aspect of the embodiments, the method may also include sequentially enabling different combinations of current sources to the transistor according to the M-bit code value, where each bit of the M-bit code corresponds to one of the current sources, and each bit of the M-bit code enables the corresponding current source when it has one value, and disables the corresponding current when it has another value. In such an arrangement, changes in a current provided to a measured transistor can be accurately controlled according to a binary value.

According to another aspect of the embodiments, the method may further include characterizing each current source prior to sequentially changing the current provided to the transistor. Such an arrangement can allow for a high degree of accuracy in the current values utilized to calculate a threshold voltage.

According to another aspect of the embodiments, characterizing each current source can include mirroring the current provided to the transistor in a mirror transistor, and measuring a voltage across a resistor coupled to the mirror transistor through which the mirrored current flows.

According to another aspect of the embodiments, the method can further include repeating steps a) through c) noted above on a different transistor in the same integrated circuit. In this way, measurements can be made at different locations of the same integrated circuit.

According to another aspect of the embodiments, the method can further include repeating steps a) through c) noted above on a different transistor in a second, different integrated circuit, where the integrated circuit and second integrated circuit are formed on the same wafer. In this way, measurements can be made at different locations of the same wafer.

According to another aspect of the embodiments, a measured transistor can be any of the following: an n-channel insulated gate field effect transistor, a p-channel insulated gate field effect transistor, and a one-transistor nonvolatile memory cell. In this way, a threshold voltage for various types of transistor devices can be measured according to the present invention.

The present invention can also include an automatic transistor threshold voltage measuring circuit formed in an integrated circuit. The circuit can include an alterable current source circuit that provides a different current in response to each of a number of different current code values. A first switch can be coupled between a measured transistor and a first comparator input. In addition, a comparator can have the first comparator input and a second comparator input selectively coupled to a plurality of reference voltages. The alterable current source circuit, at least first switch and comparator can be formed in the substrate of the integrated circuit.

According to one aspect of the embodiments, an alterable current source circuit can include a plurality of current sources that each provide a current according to the relationship:

$$Isource_N = 2^N * Ibias$$

where N is an integer of at least 0, Isource is the current provided by the particular current source, and Ibias is a current value increment. Each current source can be enabled or disabled according to a different bit value of the current code value.

According to another aspect of the embodiments, a first switch circuit can further connect a mirror transistor to a test pin of the integrated circuit.

According to another aspect of the embodiments, a circuit can further include a control circuit that outputs a sequence of current code values to the alterable current source circuit and stores a currently output current code value when the output of the comparator transitions from one value to another value.

The present invention can also include a method of measuring a threshold voltage of a transistor formed on an integrated circuit. Such a method can include a) for each of a plurality of current sources, characterizing the output current of the current source by measuring the voltage generated on a resistor external to the integrated circuit that draws a current mirroring that of the current source; b) initiating a control circuit to provide a sequence of current code values to the current sources that provide a sequentially larger amount of current to a tested transistor; c) accessing a current code value that is stored when the gate-to-source voltage of the tested transistor exceeds a reference voltage; d) deriving a current value from the code value; e) repeating steps b) through d) utilizing a different reference voltage; and f) calculating a threshold voltage for the tested transistor according to the reference voltage values and derived current values.

DETAILED DESCRIPTION

Various embodiments of the present invention will now be described in detail with reference to a number of drawings. The embodiments include circuits and methods for automatically calculating the transistor threshold voltage (Vt) of a transistor formed in an integrated circuit. The results of such a calculation can be used to compensate Vt-sensitive blocks of the integrated circuit, where Vt mismatch and/or Vt variation can affect circuit performance.

According to the embodiments of the present invention, calculation of a transistor threshold voltage can follow or depend on the simple square law equation for insulated gate field effect transistors, such as metal-oxide-semiconductor (MOS) type transistors, when operating in saturation:

$$Id = kp^*(Vgs-Vt)^2$$

where Id is a drain current, kp is a constant determined by process technology and device size, and Vgs is a gate-source voltage of the transistor.

From the above relationship, a threshold voltage can be calculated without having to rely on the constant kp. In particular, suppose that for a given transistor there is measured a first current $I_{D1}$ at a first gate-to-source voltage $V_{GS1}$, and a second current $I_{D2}$ at a second gate-to-source voltage $V_{GS2}$. Knowing $I_{D1}$, $V_{GS1}$, $I_{D2}$, and $V_{GS2}$, the threshold voltage ($V_t$) of the transistor can be calculated according to the following relationship:

$$V_t = V_{GS1} - K\sqrt{I_{D1}} \text{ or } V_t = V_{GS2} - K\sqrt{I_{D2}}, \text{ where}$$

$$K = \frac{V_{GS1} - V_{GS2}}{\sqrt{I_{D1}} - \sqrt{I_{D2}}}, \text{ and}$$

Circuits and methods according to the disclosed embodiments can use either of the above equations to automatically measure/calculate a threshold voltage of transistors across an integrated circuit in packaged form, die form, or across a wafer containing multiple integrated circuits.

An accuracy or precision of such a calculation can be in marked contrast to the above noted conventional PLL control voltage based method, which may only predict the trend of a transistor threshold variation, e.g. whether it is a slow "corner" device or a fast "corner" device, and not quantify the threshold voltage of a device to a desired degree of accuracy. "Corners" mentioned above, refer to expected variation limits in device arising from uncontrollable process variations, and the like.

Figure 1:
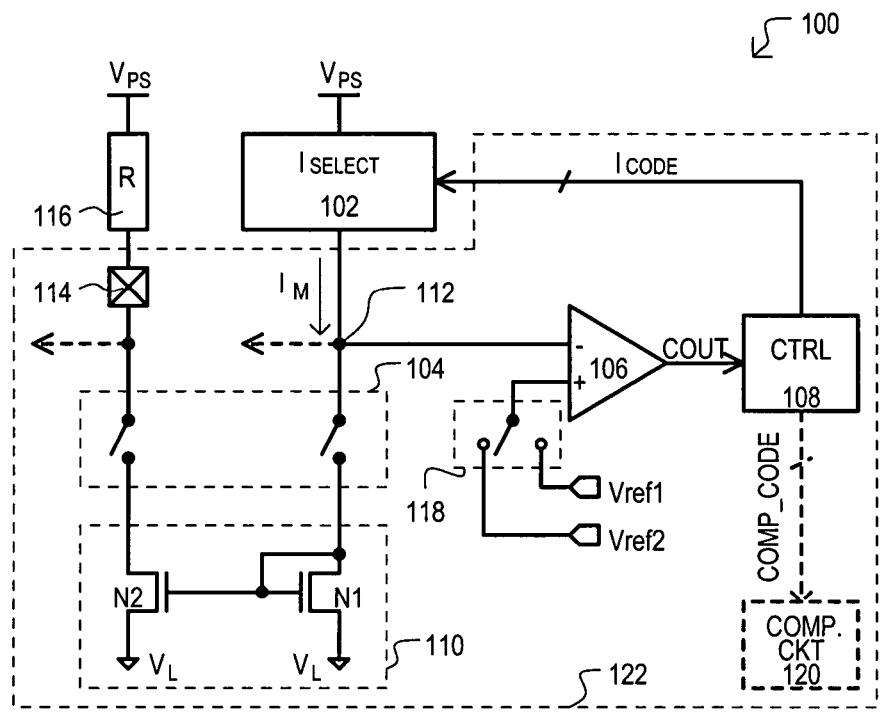
FIG. 1 is a block schematic diagram of an automatic threshold voltage measuring circuit according to a first embodiment of the present invention.

A first embodiment of the present invention set forth in FIG. 1 and designated by the general reference character 100. A first embodiment 100 can be an automatic transistor threshold voltage measuring circuit that includes an alterable current source circuit 102, a first switch circuit 104, a comparator 106, a control circuit 108, and measured section 110.

In the particular arrangement of FIG. 1, a current source circuit 102 can be connected between a high power supply $V_{PS}$ and a node 112. A current source circuit 102 can provide an output current $I_M$ to node 112 that can be varied according to a current control value input to current source 102. In this particular case, the current setting value can be a multi-bit value $I_{CODE}$.

A first switch circuit 104 can selectively connect node 112 to a measured section 110. A measured section 110 can include a measured transistor N1 and a mirror transistor N2. A measured transistor N1 can be connected in a "diode" configuration, having a gate coupled to the drain, and a source connected to a low power supply $V_L$. Thus, with respect to a low power supply voltage $V_L$, a gate-to-source voltage VGS for transistor N1 can be presented at its drain. Transistor N2 can be a "matching" transistor to N1. In particular, transistor N2 can be manufactured to have the same threshold voltage as transistor N1 and is preferably in close proximity to measured transistor N1. Transistors N1 and N2 can form a current mirror, thus the drain current of transistor N2 can mirror that of transistor N1.

Preferably, transistor N2 can be essentially identical to transistor N1 with respect to transistor size. Thus, a drain current drawn by transistor N1 will be essentially the same as that drawn by N2. However, in alternate embodiments, provided there is sufficient confidence in achievable accuracy in transistor sizing, transistor N2 may be scaled in size to the that of transistor N1, thus, a mirrored current would vary according to the width/length ratios (W/L) of such transistors.

As shown in FIG. 1, a first switch circuit 104 can also connect the drain of mirror transistor N2 to a test point 114. A resistor 116 can be connected between the test point 114 and a high power supply $V_{PS}$. In such an arrangement, a drain current of mirror transistor N2 can be derived by measuring the voltage generated at test point 114, providing the resistance of resistor 116 is known. Further, because the drain current of transistor N2 mirrors that of transistor N1, the drain current of measured transistor N1 will be known. In this way, a current provided by a current source circuit 102 can be characterized or verified.

Referring still to FIG. 1, a comparator 106 can have a first comparator input (in this particular example, the minus input "−") connected to node 112, and a second input (in this particular example the plus input "+") connected to a second switch circuit 118. An output from comparator 106 can be provided to control circuit 108. In the arrangement of FIG. 1, a second switch 118 can selectively connect one of a number of reference voltages to a second comparator.

A control circuit 108 can receive an output signal COUT from comparator 106, and provide a current setting value, in this case ICODE, to current source circuit 102. In addition, a control circuit 108 can store a particular current setting value according to a change in the output of comparator 106. Still further, in some arrangements, a control circuit 108 can provide a compensation value COMP_CODE to a compensated circuit 120. A compensated circuit 120 can be a circuit having a performance affected by a threshold voltage, and that may also be altered in response to the compensation value COMP_CODE.

In the particular embodiment of FIG. 1, most circuit components are preferably formed on the integrated circuit itself, resulting in a compact and convenient measurement arrangement. Delineation 122 shows a preferred arrangement in which all but resistor 116 are formed on the integrated circuit itself.

Having described the general components of a circuit according to a first embodiment, the operation of the circuit of FIG. 1 will now be described.

In a transistor threshold measurement operation, first switch circuit 104 can connect measured transistor N1 to node 112 and mirror transistor N2 to test point 114. In addition, second switch circuit 118 can connect one reference voltage to a second input of comparator 106. For this example, it will be assumed that the reference voltage is Vref1. Finally, a control circuit 108 can begin to issue a sequence of current control values $I_{CODE}$ in order to vary output current $I_M$ provided by current source circuit 102 to measured transistor N1.

Preferably, the sequence of current setting values ICODE provided by control circuit 108 can result in an output current $I_M$ starting with an initial smallest value and then sequentially increasing in magnitude. However, such a particular arrangement should not be construed as limiting to the invention.

In the event the smallest current value is initially provided, transistor N1 will present a relatively high impedance. Consequently, a potential at the first comparator input "−" can exceed that of the second comparator input "+", which is at Vref1, and the output of comparator 106 can be low.

Eventually, as current setting values increase the output current $I_M$ magnitude, the impedance of transistor N1 can fall. Consequently, a potential at the first comparator input "−" can fall below that of the second comparator input "+" (again, which is at Vref1), and the output of comparator 106 can switch from high to low. At this time, the current setting value $I_{CODE}$ can be stored.

In this way, a first set of values can be acquired from which a threshold voltage can be calculated. In particular, reference voltage Vref1 can correspond to a first gate-to-source voltage $V_{GS1}$ and the stored current setting value $I_{CODE}$ can correspond to the drain current $I_{D1}$ at the gate-to-source voltage $V_{GS1}$.

A circuit 100 can then repeat the above steps, but utilizing a second reference voltage Vref2. This can result in the acquisition of a second set of values for calculating a threshold voltage. In particular, reference voltage Vref2 can correspond to a second gate-to-source voltage $V_{GS2}$ and the stored current setting value $I_{CODE}$ can correspond to the drain current $I_{D2}$.

A threshold voltage $V_t$ can then be calculated as shown below (and described above):

$$V_t = V_{GS1} - K\sqrt{I_{D1}} \text{ or } V_t = V_{GS2} - K\sqrt{I_{D2}}.$$

It is noted that the above example has assumed the Vref1 and Vref1 are taken with respect to a low power supply level $V_L$. In arrangements in which there is some offset of Vref1 and Vref2 with respect to the source voltage of a measured transistor (e.g., N1), the $V_{GS1}$ and $V_{GS2}$ value can be adjusted accordingly. Further, current values $I_{D1}$ and $I_{D2}$ can be known to a high degree of accuracy by characterizing current source circuit 102 utilizing the voltage generated at test point 114, as will be described below in more detail with respect to other embodiments.

The above calculation of a threshold voltage can preferably be performed by control circuit 108 according to well understood arithmetic computation circuits and methods. Alternatively, all or a portion of such a calculation can be performed by a computation device external to the integrated circuit.

Finally, a compensation value COMP_CODE corresponding to a resulting threshold value can be provided to compensated circuit 120, to thereby alter the operation of such a circuit according to the (now) known transistor threshold value. In some embodiments, a COMP_CODE can be the same as, or can include a stored current control value $I_{CODE}$.

While the above-described embodiment has shown an arrangement in which n-channel transistor threshold voltages are measured, the present invention could also measure a threshold voltage of a p-channel MOS type transistor. One such arrangement is shown in a second embodiment in FIG. 2.

Figure 2:
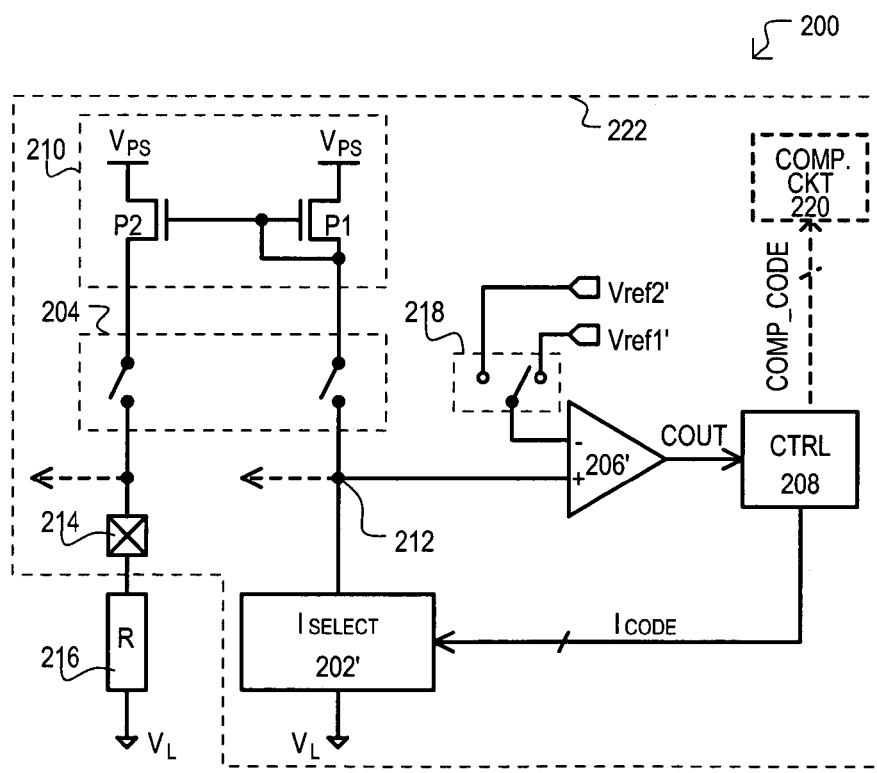
FIG. 2 is a block schematic diagram of an automatic threshold voltage measuring circuit according to a second embodiment of the present invention.

The embodiment of FIG. 2 includes some of the same circuit components as FIG. 1. Accordingly, like circuit components are referred to by the same reference character but with the first digit being a "2" instead of a "1". Further, a description of such same components will be omitted.

A second embodiment 200 can differ from that of FIG. 1 in that a measured section 210 can includes a measured transistor P1 and mirror transistor P2 that are p-channel transistors, and comparator 206' is shown with a minus "−" input connected to reference voltages Vref1' and Vref2' by a second switch 218 and a plus "+" input connected to node 212. Still further, a current source circuit 202' can be connected between node 212 and a low power supply voltage $V_L$, and a resistor 216 can be connected between test point 214 and a low power supply voltage $V_L$.

It is understood that in the arrangement of FIG. 2, when reference voltages Vref1' and Vref2' are used to calculate a threshold voltage, such voltages are derived with respect to power supply voltage $V_{PS}$, in order to correspond to a gate-to-source voltage of measured transistor P1.

It is also understood that the embodiments of FIGS. 1 and 2 have shown one particular connection arrangement for a comparator (e.g., 106 and 206') in order to generate a comparator output signal that transitions from low to high to indicate when a gate-to-source voltage of a measure transistor essentially equals the current reference voltage. However, an opposite connection arrangement could also be used, with the output of comparator making the opposite type transition.

In this way, a threshold measuring circuit can automatically measure the threshold voltage of both n-channel and p-channel MOS type transistors.

Figure 3:
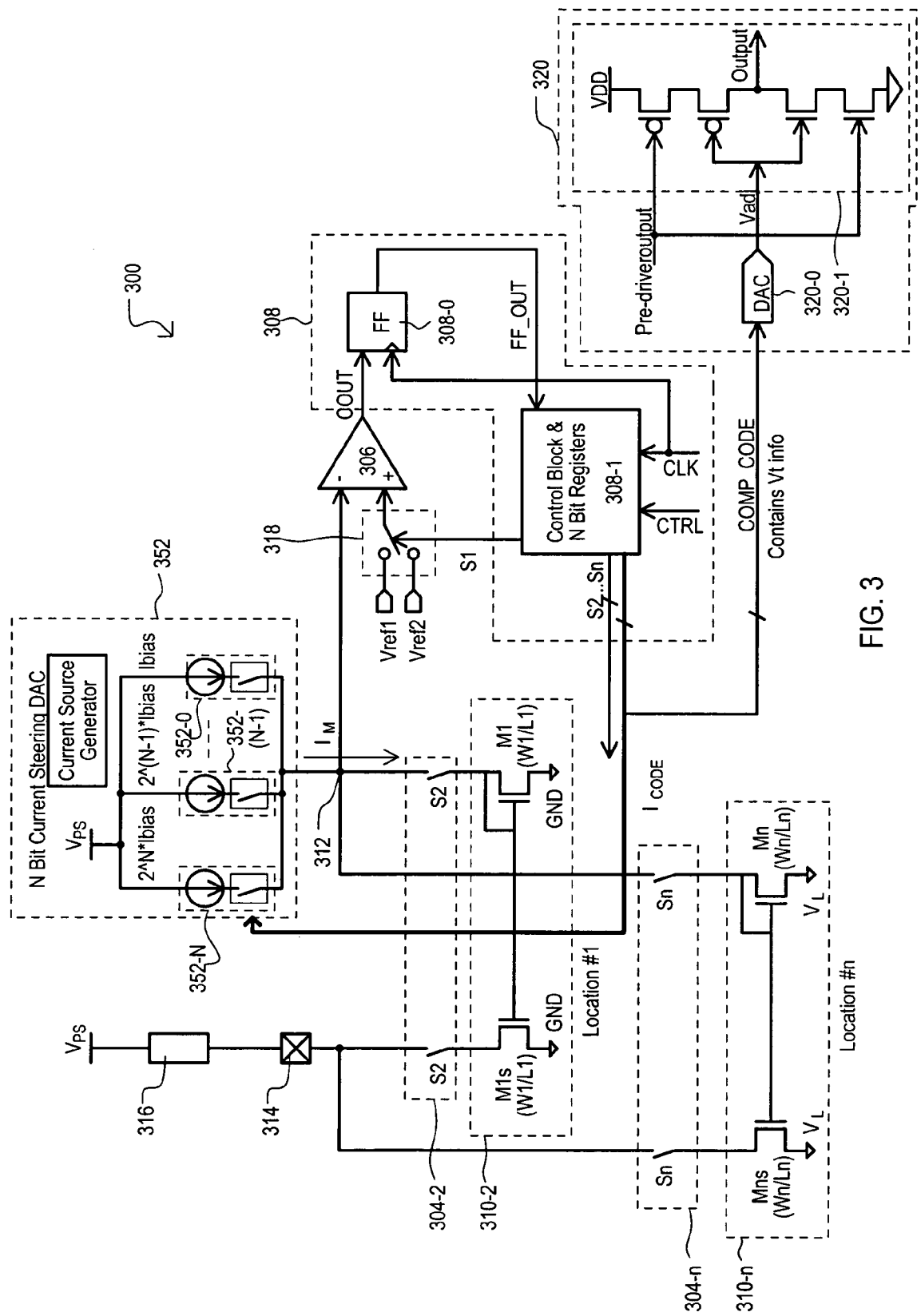
FIG. 3 is a block schematic diagram of an automatic threshold voltage measuring circuit according to a third embodiment of the present invention.

Referring now to FIG. 3, a third embodiment of the present invention is shown in a block schematic diagram and designated by the general reference character 300. The third embodiment 300 can include some of the same circuit components as FIG. 1. Accordingly, like circuit components are referred to by the same reference character but with the first digit being a "3" instead of a "1".

In the particular example of FIG. 3, a current source circuit 352 can be an M-bit current steering digital-to-analog converter (DAC) type circuit that includes a number of weighted controllable current sources 352-0 to 352-N, each of which can provide an increasingly larger amount of current. In the very particular arrangement shown, current sources (352-0 to 352-N) are weighted in a "binary" fashion. That is, with a current value "Ibias" as a minimum current increment, current sources 352-0 to 352-N, provide increases in current according to a power of two: $2^0*Ibias$, $2^1*Ibias$ up to $2^{N-1}*Ibias$, $2^N*Ibias$. Each current source (352-0 to 352-N) can be enabled according to one bit of a multi-bit code value $I_{CODE}$. In such an arrangement, sequentially increasing an output current $I_M$ value can be accomplished with a conventional binary count.

In addition, FIG. 3 shows multiple measured sections 310-2 to 310-n, each of which can be separately connected to node 312 and test pin 314 according to first switch circuits 304-2 to 304-n. First switch circuits (304-2 to 304-n) can be controlled by switch signals S2 to Sn, respectively. It is understood that transistors within each measured sections (310-2 to 310-n) can be the same, but may also be of different sizes. This is represented by the width/length ratio labels (W1/L1 to Wn/Ln) of FIG. 3. Still further, while the size of a mirror transistor preferably matches that of the corresponding measured transistor, such a transistor may be scaled and calculations adjusted accordingly, as noted above.

Such an arrangement illustrates how a threshold voltage can be measured for multiple transistors at different locations, to thereby measure variations in threshold voltage between such different locations.

The embodiment of FIG. 3 also shows a control circuit 308 that includes a detect flip-flip (FF) 308-0 and control block and register 308-1. A detect FF 308-0 can store the signal output from comparator 306, and thus can be capable of flipping polarity of a signal FF_OUT to control circuit 308 to indicate that a potential at node 312 is essentially equal to a current reference voltage.

A control block and register 308-1 can receive control signals CTRL and a clock signal CLK, and can include a state machine that controls switch according to signals S1–Sn, current source circuit 352, and generates and outputs an M-bit current setting value $I_{CODE}$. It is noted that if current source circuit 352 includes N+1 binary weighted current sources, an M-bit value can include at least N+1 bits. A control block and register 308-1 can also include a register for storing a current setting value $I_{CODE}$ that results in an output of detect FF 308-0 flipping polarity. In particular embodiments, a control block and register 308-1 may also include computational circuits for calculating a threshold voltage according to any of the relationships noted above. In such cases, registers can be provided to store at least two current setting values $I_{CODE}$.

In this way, values for calculating a transistor threshold voltage and/or actual threshold voltage calculations can be executed by a circuit formed in an integrated circuit.

Referring still to FIG. 3, a circuit 300 may also include compensated circuit 320 that includes an output driver circuit. One example of such a compensated circuit 320 is represent in a very general fashion in FIG. 3, and can include a DAC 320-0 and driver circuit 320-1. A DAC 320-0 can receive a compensation code value COMP_CODE and generate an adjustment voltage Vadj. Such an adjustment voltage can be applied to a driver circuit 320-1, to thereby compensate for an undesirable slew rate arising from threshold voltages falling outside a desired range.

An arrangement like that of FIG. 3 can thus be used to adjust a slew rate of an output driver. For example, such an arrangement can result in less variation in output driver slew rate, particularly in devices having relatively small geometries and hence smaller power supplies, such as those manufactured according to 90 nm processes and/or operating at or about a one voltage power supply. At such smaller sizes/lower operating voltage, variations in threshold voltage can have significant effects on performance. Alternatively, such arrangement can be implemented in a content addressable memory (CAM) device, where output driver slew rate can vary by almost a factor of three.

In addition or alternatively, the above arrangement can reduce simultaneous switching output (SSO) noise by more tightly controlling slew rate variation as compared to devices without compensation. As is well understood, output driver slew rate can be function of the current drive capabilities of transistor devices included therein, which is a function of the threshold voltage.

Figure 4:
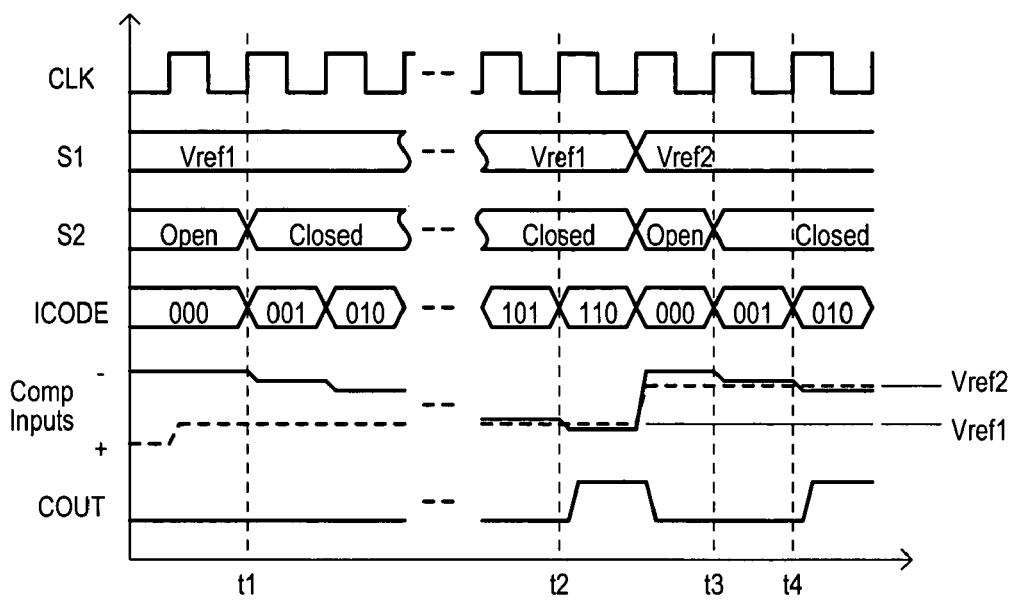
FIG. 4 is a timing diagram showing the operation of the circuit shown in FIG. 3.

The operation of the circuit shown in FIG. 3 will now be described in conjunction with a FIG. 4. FIG. 4 is a timing diagram that includes a waveform for clock signal CLK, waveform S1 which shows the status of switch 318, S2 which shows the status of first switch S2, current selection code ICODE, "+" and "−" inputs to comparator 306, and COUT which shows an output of comparator 306.

For convenience of description, current selection code ICODE is shown as a three-bit value. However, it is understood that such a code may include fewer, or preferably, more bits.

Referring now to FIG. 3 in conjunction with FIG. 4, at time t1, a first switch 318 can be connecting to a first reference voltage Vref1 to a non-inverting input of comparator 306, and switch 304-2 can connect measured transistor M1 to node 312 and mirror transistor M1s to test point 314. In addition, a current selection code ICODE (in this example "001") can allow some minimal increment of current $I_M$ to flow through measured transistor M1. Measured transistor M1 can present a relatively higher impedance, and thus maintain the "−" input of comparator 306 at a higher potential than the "+" input. Consequently, the output of comparator C_OUT is low.

According to clock signal CLK, a current selection code ICODE can be incremented, resulting in a larger amount of current being provided to measured transistor M1. However, up until time t2, measured transistor M1 continues to provide a gate-to-source voltage that remains above reference voltage Vref1.

At time t2, a current selection code ICODE reaches "110", providing a current that results in the potential at the "−" input of comparator 306 falling below that of the "+" input. Consequently, the output of comparator COUT switches to a high value. This value is latched in detect flip-flop 308-0 and then output to control block and register 308-1. In response to such a value, the present current selection code ICODE (in this case "110") can be stored in a register within control block and register 308-1.

At time t3, a circuit 300 can start to acquire a second set of values. Switch 318 can connect a second reference voltage Vref2 to a non-inverting input of comparator 306. The measuring method can repeat with switch 304-2 connecting measured transistor M1 to node 312 and mirror transistor M1s to test point 314, and a current selection code ICODE (in this example "001") causing some minimal increment of current $I_M$ to flow through measured transistor M1.

At time t4, a current selection code ICODE reaches "010", providing a current that results in the gate-to-source voltage of measured M1 transistor to essentially equal reference voltage Vref2. Consequently, the output of comparator COUT switches to a high value, and present current selection code ICODE can be latched.

The stored ICODE values can be utilized to derive drain current value $I_{D1}$ and $I_{D2}$, either directly or indirectly. Notably, if current sources are characterized utilizing resistor 316 and test point 314, such a value can be derived with a high degree of accuracy. The reference voltages, Vref1 and Vref2, can be known values used to derive gate-to-source voltages $V_{GS1}$ and $V_{GS2}$, respectively. A resulting threshold voltage may then be calculated according to either of the relationships noted above.

It is understood that the above measurements can be repeated for transistors in other measured sections, such as measured section 310-n by way of the corresponding switch 304-n.

While FIG. 3 shows an embodiment that includes a general depiction of the automatic compensation for an output driver, alternate embodiments may provide different compensation applications. Such alternate embodiments will now be described with reference to FIGS. 5 to 8.

Figure 5:
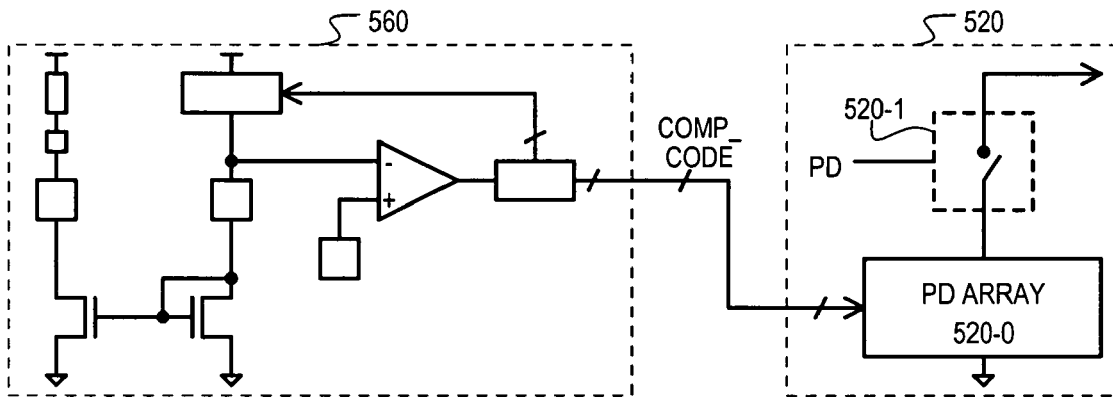
FIG. 5 is a block schematic diagram of an automatic threshold voltage measuring circuit according to a fourth embodiment of the present invention.

FIG. 5 is a block schematic diagram showing a threshold voltage measuring circuit according to a fourth embodiment that can automatically compensate for an impedance, such as that occurring at an input or output. The circuit 500 of FIG. 5 includes a threshold measuring section 560 and a compensated circuit 520. A threshold measuring section 560 may include the various components set forth in any of the first through third embodiments, and can output of compensation code COMP_CODE value generated as described above.

The particular compensated circuit 520 of FIG. 5 can be an output driver circuit that includes a pull-down array 520-0 and enable circuit 520-1. As is well understood, a pull-down array 520-0 can include a number of impedance elements selectively enabled to provide a desired output impedance. A compensation code COMP_CODE can compensate for any impedance variations arising from threshold voltage values, particularly if the pull-down array 520-0 utilizes transistors as impedance elements.

Of course, the above arrangement can be used to compensate a pull-up array in the same general fashion. Further, such approaches may be utilized for input pull-up and pull-down arrays.

The above-embodiment can thus be utilized in a high speed signaling system, where impedance matching between inputs/outputs and line impedance (e.g., printed circuit board traces) is necessary in order to reduce signal reflection.

In this way, the fourth embodiment can compensate for impedance variations that might arise from variations in threshold voltage.

Figure 6A:
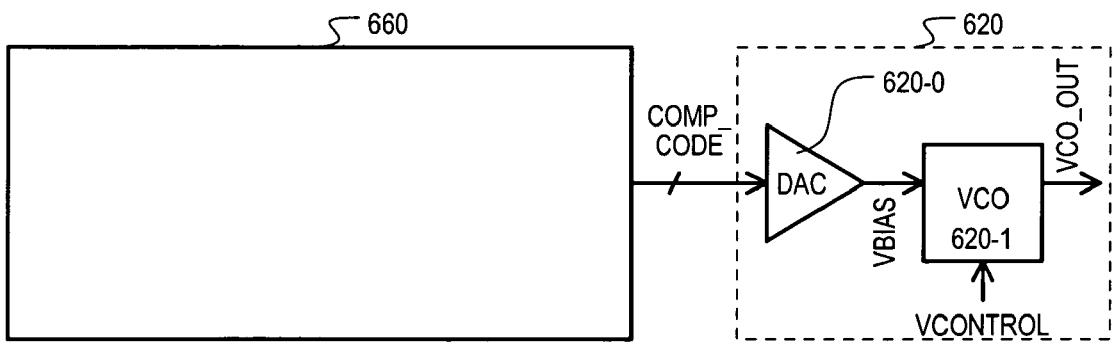
FIGS. 6A and 6B are block schematic diagrams of an automatic threshold voltage measuring circuit according to a fifth embodiment of the present invention.
Figure 6B:
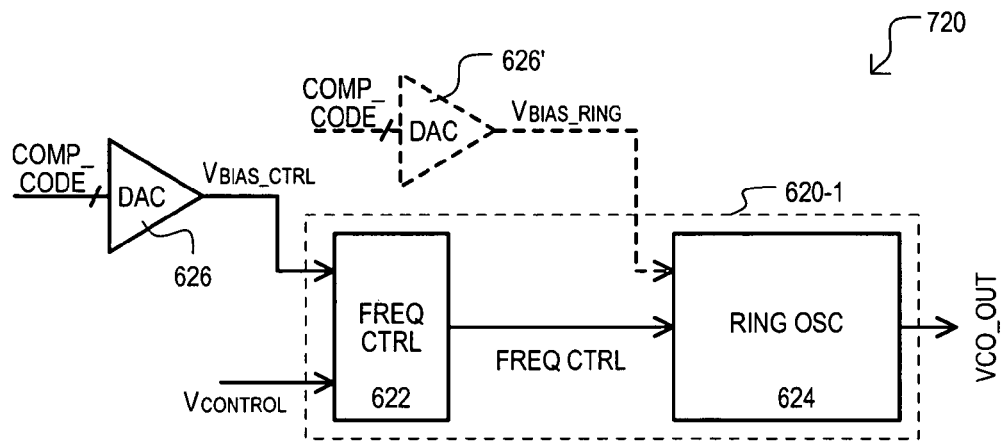

FIGS. 6A and 6B is a block schematic diagram showing a threshold voltage measuring circuit according to a fifth embodiment that can automatically compensate the gain of a voltage controlled oscillator (VCO).

The circuit 500 of FIG. 6A can include a threshold measuring section 660 and a compensated circuit 620. As in the case of the fourth embodiment, the threshold measuring section 660 may include the various components set forth in any of the first through third embodiments, and can output of compensation code COMP_CODE value generated as described above.

The particular compensated circuit 520 of FIG. 5 can include a DAC 620-0 and VCO 620-1. DAC 620-0 can generate a bias voltage VBIAS according to a COMP_CODE value. Such a bias voltage VBIAS can be used to alter a VCO gain and thereby compensate for gain changes arising from transistor threshold voltage variations.

FIG. 6B shows two possible ways in which a VCO gain can be compensated for variations in threshold voltage. One example is shown by solid lines, the other is shown with dashed lines. FIG. 6B shows a VCO circuit 620-1 that includes a frequency control section 622 and a ring oscillator 624. As is well understood by those skilled in the art, a frequency control section 622 can receive a control voltage $V_{CONTROL}$, and in response thereto, can generate a frequency control signal FREQ CTRL. In response to the FREQ CTRL signal, a ring oscillator 624 can generate a periodic signal VCO_OUT.

In a first example of compensation, compensation code COMP_CODE can be applied to a DAC 626, which generates a control bias voltage $V_{BIAS\_CTRL}$. Such a control bias voltage can be used to compensate for variations in a control voltage $V_{CONTROL}$ that may arise from transistor threshold voltage variations. In this way, a VCO timing may be altered to account for threshold voltage changes.

Alternatively, or in addition, in a second example of compensation, a compensation code COMP_CODE can be applied to a DAC 626', which generates an oscillator bias voltage VBIAS_CTRL. Such a bias voltage can be applied to the stages of a ring oscillator to thereby increase/decrease the propagation time of each such stage, and thereby alter the VCO operation.

As is understood by those skilled in the art, a phase locked loop (PLL) dynamic (bandwidth, jitter, etc.) can be function of the VCO gain, which is a function of VCO delay. VCO delay can be determined by transistor threshold voltage. Generally, a PLL dynamic is determined by timing/jitter requirements imposed by conditions external to the device. Thus, a tightly controlled VCO gain is desirable to provide a PLL capable of meeting desired operating conditions. The above embodiment can be used to compensate VCO gain, for more tightly controllable value.

In this way, a fifth embodiment can compensate for VCO gain changes that can arise from variations in threshold voltage.

Figure 7:
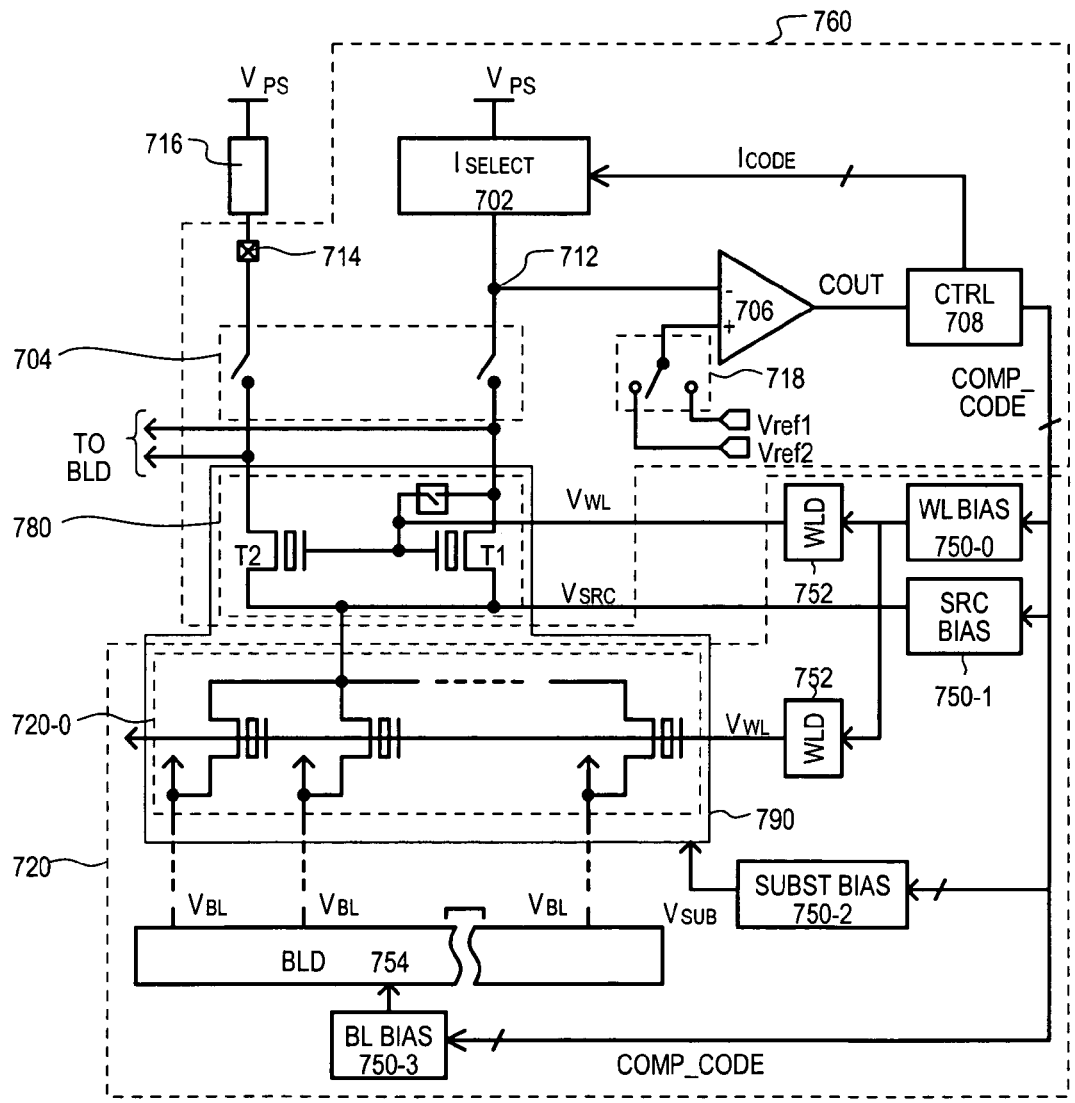
FIG. 7 is a block schematic diagram of an automatic threshold voltage measuring circuit according to a sixth embodiment of the present invention.

FIG. 7 is a block schematic diagram showing a threshold voltage measuring circuit according to a sixth embodiment that can automatically compensate programming/erase voltages for one transistor (1-T) type memory cells in a nonvolatile memory device based on a threshold voltage of such cells.

FIG. 7 includes a threshold measuring section 760 and a compensated circuit 720. As in the case of the fourth embodiment, the threshold measuring section 760 may include the various components set forth in any of the first through third embodiments, and can output of compensation code COMP_CODE value generated as described above.

However, in the example of FIG. 7, within measured section 760, measured transistor T1 and mirror transistor T2 are nonvolatile memory cells. As is well understood, such cells can be one-transistor floating gate "flash" type cells, silicon-oxide-nitride-oxide-silicon (SONOS) type memory cells, or metal-nitride-oxide-silicon (MNOS), as but a few examples. Further, a threshold voltage of such cells may be measured before and after a programming operation and/or erase operation. In this way, one or more compensation codes COMP_CODE can be generated that can reflect an actual programmed or erased state for a memory cell. It is understood that measured memory cell T1 and mirror memory cell T2 can be programmed and erased in the same general fashion as other memory cells on the device, and so can be connected to the same word line, source, substrate, and bit line voltages as other memory cells. As such, memory cell T1 may include a switch between gate and drain to enable such programming.

A compensated circuit 720 can be a nonvolatile memory device. In particular, a compensated circuit 720 can include an array 720-0 of memory cells that match those of measured section 780. According to well understood techniques, transistors 720-0 can be programmed and/or erased according to any of a word line voltage $V_{WL}$, source voltage $V_{SRC}$, substrate voltage $V_{SUB}$, or bit line voltage $V_{BL}$. FIG. 7 shows generation circuits for these voltages as 750-0 to 750-3. A word line voltage $V_{WL}$ can be applied by way of word line driver circuits 752 and bit line voltage $V_{BL}$ can be applied by way of bit line driver circuits 754. A source voltage $V_{SRC}$ can be applied to the sources of memory cells, which in this case, are arranged in a "common source" (or "virtual ground") configuration. A substrate voltage $V_{SUB}$ can be applied to a substrate 790 (e.g., substrate or well) that includes the memory cells.

As shown, a compensation code COMP_CODE can be applied to voltage generation circuits (750-0 to 750-3), to thereby alter an applied voltage in the event a measured threshold voltage of measured memory cell T1, varies from a desired threshold voltage.

In this way, a sixth embodiment can compensate for threshold voltages of nonvolatile memory transistors. More particularly, the sixth embodiment can be used to check an actual programmed threshold voltage of a memory cell and make sure that sufficient programming voltage is applied for higher reliability.

Figure 8:
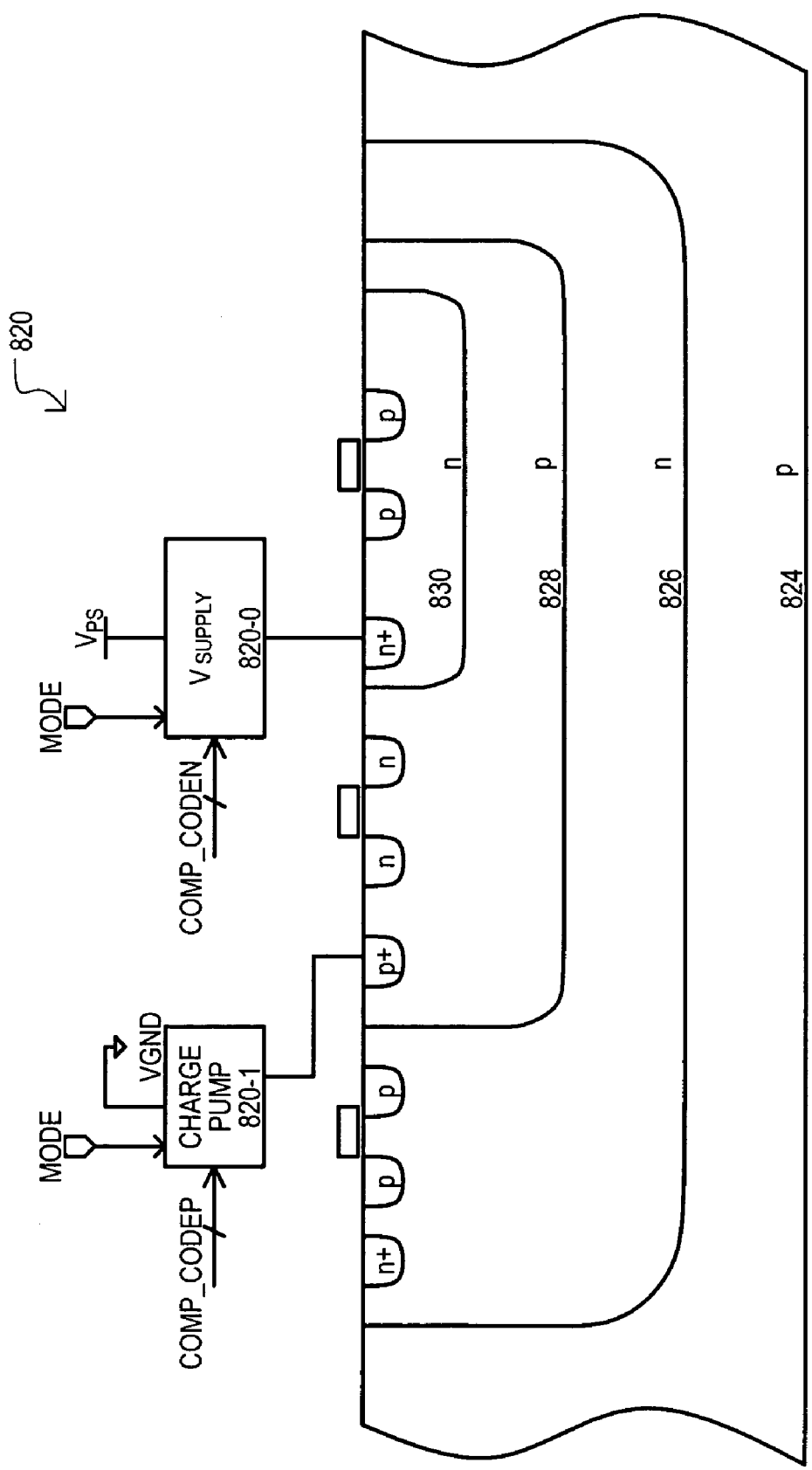
FIG. 8 is a block schematic diagram and side cross sectional view of an automatic threshold voltage measuring circuit according to a seventh embodiment of the present invention.

FIG. 8 is a block schematic diagram showing a seventh embodiment that can automatically compensate for threshold voltages by altering a substrate/well biasing voltage. As is well understood, transistor characteristics can be altered according to a "body" voltage applied to the transistor. As but two examples, transistor speed and leakage current can be adjusted according to a transistor body voltage. Even more particularly, a body voltage can be increased in a reverse bias direction when speed is not critical (e.g., n-channel transistor bodies made more negative, or p-channel devices made more positive), or a body voltage can be more forward biased in the event faster transistor speed is desired.

Referring still to FIG. 8, to avoid unduly cluttering the view a threshold measuring section has been omitted. Accordingly, it is understood that the compensation codes COMP_CODE can be generated according to any of the general approaches noted above.

FIG. 8 also depicts a side cross sectional view of an integrated circuit that includes a threshold measuring section. The particular integrated circuit shown is a "triple well" device. In such an arrangement, a substrate 824 can include a first well 826, a second well 828 and a third well 830. The substrate 824 and wells (826, 828, 830) may each be biased to a particular potential. In the very particular example of FIG. 8, a p-well 828 can be biased according to a first biasing circuit 820-0 and an n-well 830 can be biased according to a second biasing circuit 820-1.

Because well 828 is a p-well, it can be biased to a lower potential with respect to the n-wells. Thus, in the very particular example of FIG. 8, a first biasing circuit 820-0 can be a charge pump circuit for providing a "back bias" voltage. Even more particularly, according to a mode signal MODE, a first biasing circuit 820-0 can provide one biasing voltage (e.g., ground) for a high speed operation, and another biasing voltage for a low leakage operation (e.g., a negative back-bias voltage). Still further, such values may be adjusted according to a compensation code COMP_CODEP to account for changes in a threshold voltage of n-channel devices formed in p-well 928. It is thus assumed that a compensation code COMP_CODEP is derived from a measured transistor and corresponding mirror transistor are manufactured according to the same techniques as n-channel devices formed within p-well 928.

In a similar fashion, according to a mode signal MODE, a second biasing circuit 820-1 can provide one of at least two different biasing voltages (e.g., a high power supply voltage, or a boosted power supply voltage, as an n-well biasing voltage. Again, such values may be adjusted according to a compensation code COMP_CODEN to account for changes in a threshold voltage of p-channel devices formed in n-well 930. It is thus assumed that a compensation code COMP_CODEN is derived from a measured transistor and corresponding mirror transistor are manufactured according to the same techniques as p-channel devices formed within n-well 930.

In this way, a seventh embodiment can compensate for differences in threshold voltages of transistors by altering biasing voltage to wells and/or a substrate. More particularly, the embodiment can provide biasing for a triple well process, where speed gain or leakage current reduction can be achieved by biasing substrate/wells. Reverse biasing of a substrate/well can reduce leakage current when speed is not critical, whereas forward biasing can be used when speed is critical. As such, the embodiment can serve as a process indicator such that a more forward or more reverse bias can be applied depending upon process variation.

Figure 9:
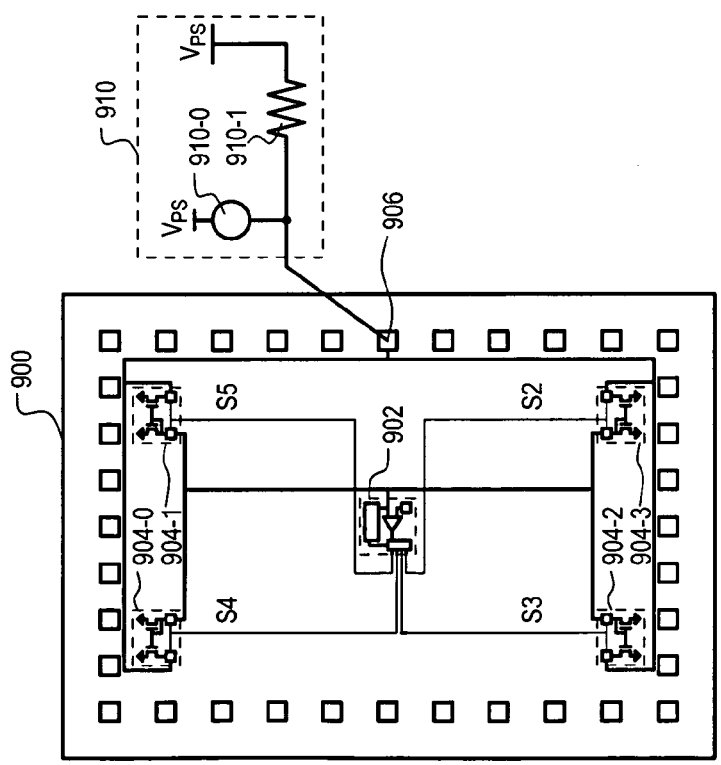
FIG. 9 is a top plan view of an integrated circuit according to another embodiment of the present invention.

As noted above, the present invention may advantageously include a measuring circuit shared among multiple measured sections. FIG. 9 is a diagrammatic representation showing this general principle. FIG. 9 is a top down view of an integrated circuit 900 having a centralized measuring section 902 and four different remote measured sections 904-0 to 904-3. Also shown is a test point 906, which in this example can be a bond pad. It is understood that FIG. 9 is not drawn to scale and the various signal routings are arbitrarily drawn.

A measuring section 902 can include any of the various measuring circuit components described above, such as for example, a current source circuit, comparator, and control circuit. Each remote measured section (904-0 to 904-3) can include a can include a measured transistor and corresponding mirror transistor. In addition, each remote measured section (904-0 to 904-3) may also include a switch circuit for connecting such transistors to the measuring section 902 and test point 906, respectively. A measuring section 902 can provide switch control signals S2 to S5 to operate these switch circuits, and thus measure a threshold voltage of the transistors therein. Of course, such switch circuits may be situated closer to measuring sections 902.

FIG. 9 also includes an external tester 910, which can include a voltmeter 910-0 and a resistor 910-1. Such portions can be connected to test point 908 and operated as described above to characterize a current supply circuit.

In this way, circuits can be provided "on-chip" that can characterize any variations in threshold voltage occurring within the same device.

Figure 10:
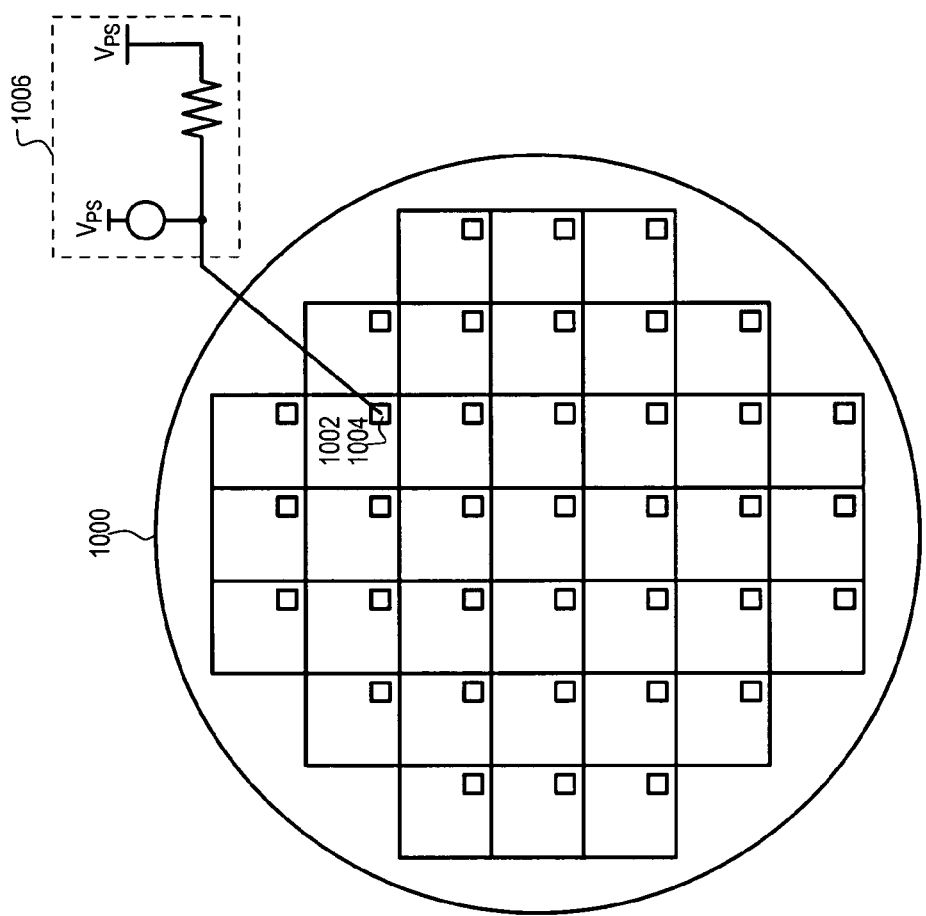
FIG. 10 is a top plan view of a wafer according to another embodiment of the present invention.

While threshold voltages may be characterized across one integrated circuit, as shown above, the present invention may also characterize threshold voltages across a wafer containing multiple integrated circuits. FIG. 10 is a diagrammatic representation showing this general principle. FIG. 10 is a top down view of a wafer 1000 in which a number of integrated circuits (one of which is shown as 1002) are formed. Each integrated circuit can include a test point (e.g., 1004) to which external test equipment 1006 can be connected.

Each integrated circuit 1000 can include a measuring section and at least one measured section (not shown), and a transistor threshold can be characterized as noted above.

As in the case of FIG. 9, it is understood that FIG. 10 is not drawn to scale and the number, size placement of integrated circuits is arbitrarily drawn.

In this way, circuits can be provided "on-chip" that can characterize any variations in threshold voltage occurring across a wafer.

While the present invention has been described in terms of devices and circuits, above, embodiments of the present invention can include methods according to the various steps described above.

Figure 11:
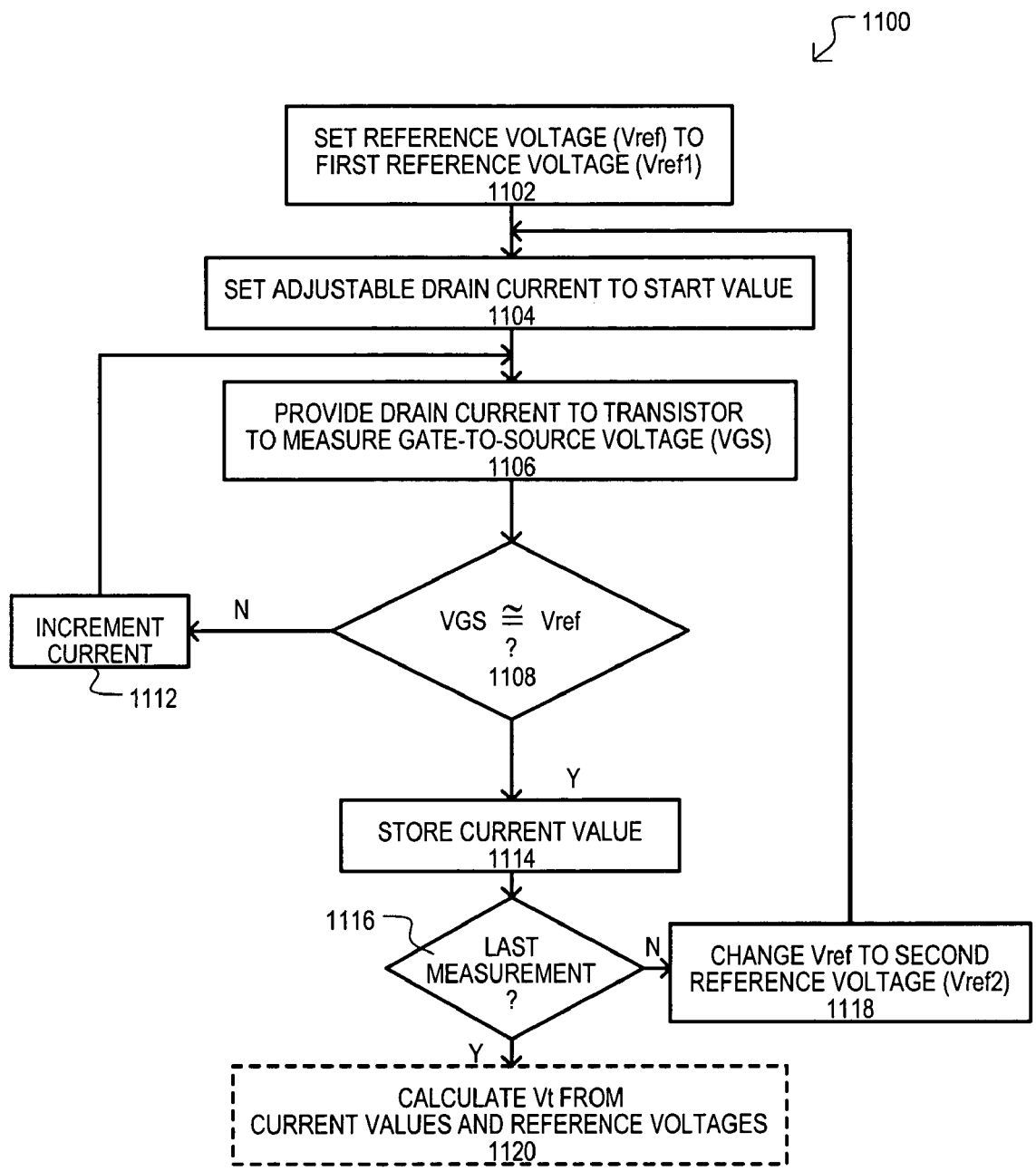
FIG. 11 is a flow diagram of a method according to one embodiment of the present invention.

In addition, another method according to an embodiment of the present invention is shown in FIG. 11 and designated by the general reference character 1100. A method 1100 can include setting a reference voltage to a first reference voltage (step 1102). An adjustable drain current can be set to a start value (step 1104). Such a drain current can be provided to a transistor to measure a gate-to-source voltage (VGS) (step 1104). Such a current can be provided directly to the drain of a transistor that is being measured (or a corresponding mirroring transistor) (step 1106). A gate-to-source voltage developed across the measured transistor can then be compared to the reference voltage (step 1108). If such a VGS voltage does not yet essentially equal the reference voltage (N branch from 1108), the provided drain current can be incremented (step 1112) and the method can return to step 1106. If such a voltage essentially does equal the reference voltage (Y branch from 1108), the value of such a current can be stored (step 1114).

A method can then repeat or continue depending upon whether all measurements have been taken (step 1116). If the stored value is not a last value to be measured (e.g., second value of same transistor has not yet been taken) (N branch from 1116), a reference voltage can be changed to a second reference voltage (step 1118) and a method can return to step 1104. If the stored value is a last value to be measured (Y branch from 1116), a threshold voltage can be calculated from stored current values and the reference voltage used to acquire such current values (step 1120).

Preferably, all or most of the above steps can be performed by circuits existing on the same integrated circuit.

The various embodiments disclosed above can have advantages over conventional techniques like those noted above. Such advantages may include (i) automatically measuring/calculating the threshold voltage of a transistor at any given location on-chip with quantitative results; (ii) automatically giving an indication of threshold voltage mismatch and process variations for a given silicon material and/or process; (iii) a threshold voltage measured with a high accuracy—that is with more bits of current steering DAC, higher accuracy can be achieved; and (iv) an output value can be a multi-bit code, which can be easily converted into voltage or current to compensate various blocks that are sensitive to threshold variation, or for biasing variations in multiple well processes, such as a triple well process.

It is understood that the embodiments of the invention may be practiced in the absence of an element and or step not specifically disclosed. That is, an inventive feature of the invention can be elimination of an element or step.

The foregoing description of specific embodiments and examples of the invention have been presented for the purpose of illustration and description, and although the invention has been described and illustrated by certain of the preceding examples, it is not to be construed as being limited thereby. They are not intended to be exhaustive or to limit the invention to the precise forms disclosed, and many modifications, improvements and variations within the scope of the invention are possible in light of the above teaching. It is intended that the scope of the invention encompass the generic area as herein disclosed, and by the claims appended hereto and their equivalents.

What is claimed is:

1. A method of determining a threshold voltage (Vt) of at least one of a number of transistors in an integrated circuit, comprising the steps of:
    a) sequentially changing the magnitude of a current provided to a transistor according to an M-bit code values until an output voltage from the transistor is substantially equal to a reference voltage, where M is an integer greater than 1;
    b) storing an M-bit code value that corresponds to the current that results in the output voltage being substantially equal to the reference voltage; and
    c) repeating steps a) and b) for a different reference voltage; wherein steps a) through c) are performed by circuits formed in the integrated circuit.

2. The method of claim 1, further including:
prior to step a), selecting one of a number of transistors on the integrated circuit as the transistor to which the current is provided.

3. The method of claim 1, further including:
generating a first current value from a first M-bit code value corresponding to a first reference voltage; and
generating a second current value from a second M-bit code value corresponding to a second reference voltage.

4. The method of claim 3, further including:
calculating a threshold voltage of the transistor with the first reference voltage, second reference voltage, first current value, and second current value.

5. The method of claim 4, wherein:
calculating the threshold voltage ($V_t$) includes calculating the threshold voltage according to the relationship:

$$V_t = V_{GS1} - K\sqrt{I_{D1}} \text{ or } V_t = V_{GS2} - K\sqrt{I_{D2}}, \text{ where}$$

$$K = \frac{V_{GS1} - V_{GS2}}{\sqrt{I_{D1}} - \sqrt{I_{D2}}}, \text{ and}$$

where $V_{GS1}$ is derived from the first reference voltage and $I_{D1}$ is derived from the first current value, and $V_{GS2}$ is derived from the second reference voltage and $I_{D2}$ is derived from the second current value.

6. The method of claim 4, further including:
adjusting the impedance of an output driver path of the integrated circuit according to the calculated threshold voltage.

7. The method of claim 4, further including:
adjusting a bias voltage provided to a voltage controlled oscillator formed in the integrated circuit according to the calculated threshold voltage.

8. The method of claim 4, further including:
adjusting a bias voltage provided to at least one portion of the substrate of the integrated circuit according to the calculated threshold voltage.

9. The method of claim 4, further including:
adjusting at least one programming voltage provided to a plurality of nonvolatile transistors formed in the integrated circuit according to the calculated threshold voltage.

10. The method of claim 1, wherein:
the step of sequentially changing the magnitude of the current provided to the transistor includes sequentially enabling different combinations of current sources according to the M-bit code value, where each bit of the M-bit code corresponds to one of the current sources and enables the corresponding current source when it has one value, and disables the corresponding current when it has another value.

11. The method of claim 10, further including:
characterizing each current source prior to sequentially changing the current provided to the transistor.

12. The method of claim 11, wherein:
characterizing each current source includes
mirroring the current provided to the transistor in a mirror transistor, and
measuring a voltage across a resistor coupled to the mirror transistor through which the mirrored current flows.

13. The method of claim 1, further including:
repeating steps a) through c) on a different transistor in the same integrated circuit.

14. The method of claim 1, further including:
repeating steps a) through c) on a different transistor in a second, different integrated circuit, where the integrated circuit and second integrated circuit are formed on the same wafer.

15. The method of claim 1, wherein:
the transistor is selected from the group consisting of, an n-channel insulated gate field effect transistor, a p-channel insulated gate field effect transistor, and a one-transistor nonvolatile memory cell.

16. An automatic transistor threshold voltage measuring circuit formed in an integrated circuit, comprising:
an alterable current source circuit that provides a different current in response to each of a number of different current code value;
at least a first switch circuit coupled between a measured transistor and a first comparator input; and
a comparator having the first comparator input and a second comparator input selectively coupled to a plurality of reference voltages; wherein
the alterable current source circuit, at least first switch circuit and comparator are formed in the substrate of the integrated circuit.

17. The automatic transistor threshold voltage measuring circuit of claim 16, wherein:
the alterable current source circuit comprises a plurality of current sources that each provide a current according to the relationship:

$$Isource_N = 2^N * Ibias,$$

where N is an integer of at least 0, Isource is the current provided by the particular current source, and Ibias is a current value increment, each current source being enabled or disabled according to a different bit value of the current code value.

18. The automatic transistor threshold voltage measuring circuit of claim 16, wherein:
the at least first switch circuit further connects a mirror transistor to a test point of the integrated circuit.

19. The automatic transistor threshold voltage measuring circuit of claim 16, further including:
a control circuit that outputs a sequence of current code values to the alterable current source circuit and stores the output current code value when the output of the comparator transitions from one value to another value.

20. A method of measuring a threshold voltage of a transistor formed on an integrated circuit, comprising the steps of:
a) for each of a plurality of current sources, characterizing the output current of the current source by measuring the voltage generated on a resistor external to the integrated circuit that draws a current mirroring that of the current source;
b) initiating a control circuit to provide a sequence of current code values to the current sources that provide a sequentially larger amount of current to a tested transistor;
c) accessing a current code value that is stored when the gate-to-source voltage of the tested transistor essentially equals a reference voltage;
d) deriving a current value from the code value;
e) repeating steps b) through d) utilizing a different reference voltage; and
f) calculating a threshold voltage for the tested transistor according to the reference voltage values and derived current values.

* * * * *